(12) United States Patent
Schnell

(10) Patent No.: US 11,346,893 B2
(45) Date of Patent: May 31, 2022

(54) METHOD AND ASSESSMENT UNIT FOR DETERMINING THE REMAINING SERVICE LIFE OF A CAPACITOR, AND SYSTEM

(71) Applicant: ZIEHL-ABEGG SE, Künzelsau (DE)

(72) Inventor: Marco Schnell, Pfedelbach-Renzen (DE)

(73) Assignee: ZIEHL-ABEGG SE, Kunzelsau (DE)

( * ) Notice: Subject to any disclaimer, the term of this patent is extended or adjusted under 35 U.S.C. 154(b) by 121 days.

(21) Appl. No.: 16/766,691

(22) PCT Filed: Nov. 5, 2018

(86) PCT No.: PCT/DE2018/200099
§ 371 (c)(1),
(2) Date: May 24, 2020

(87) PCT Pub. No.: WO2019/101273
PCT Pub. Date: May 31, 2019

(65) Prior Publication Data
US 2020/0363480 A1 Nov. 19, 2020

(30) Foreign Application Priority Data
Nov. 24, 2017 (DE) .................... 10 2017 221 096.6

(51) Int. Cl.
*G01R 31/64* (2020.01)
*G01R 27/26* (2006.01)
(Continued)

(52) U.S. Cl.
CPC ......... *G01R 31/64* (2020.01); *G01R 27/2605* (2013.01); *G01R 31/003* (2013.01); *G01R 31/016* (2013.01)

(58) Field of Classification Search
CPC .. G01R 31/64; G01R 27/2605; G01R 31/003; G01R 31/016
(Continued)

(56) References Cited

U.S. PATENT DOCUMENTS

2009/0088993 A1   4/2009   Oohasi et al.
2013/0164488 A1*  6/2013   Wood .................. F01D 9/041
                                                    428/80

FOREIGN PATENT DOCUMENTS

CN       104100570 A     10/2014
DE    112009000643 T5     1/2011
(Continued)

*Primary Examiner* — Farhana A Hoque
(74) *Attorney, Agent, or Firm* — Jason P. Mueller; FisherBroyles, LLP

(57) ABSTRACT

A method for determining the remaining service life of a capacitor is disclosed, wherein the capacitor may be formed by an electrolytic capacitor. The method includes the stages of: measuring a voltage change across the capacitor during a discharging time, determining a discharging current during the discharging time, determining an actual capacitance of the capacitor on the basis of the voltage change, the discharging current and the discharging time, determining a corrected capacitance of the capacitor from the actual capacitance based on an error correction, wherein influences of the temperature on the capacitance of the capacitor are corrected during the error correction, and determining the remaining service life on the basis of a difference between the corrected capacitance and an initial capacitance of the capacitor. A system including an assessment device, configured to perform this method, and a circuit having at least one capacitor to be assessed are also disclosed.

20 Claims, 6 Drawing Sheets

Figure 1:
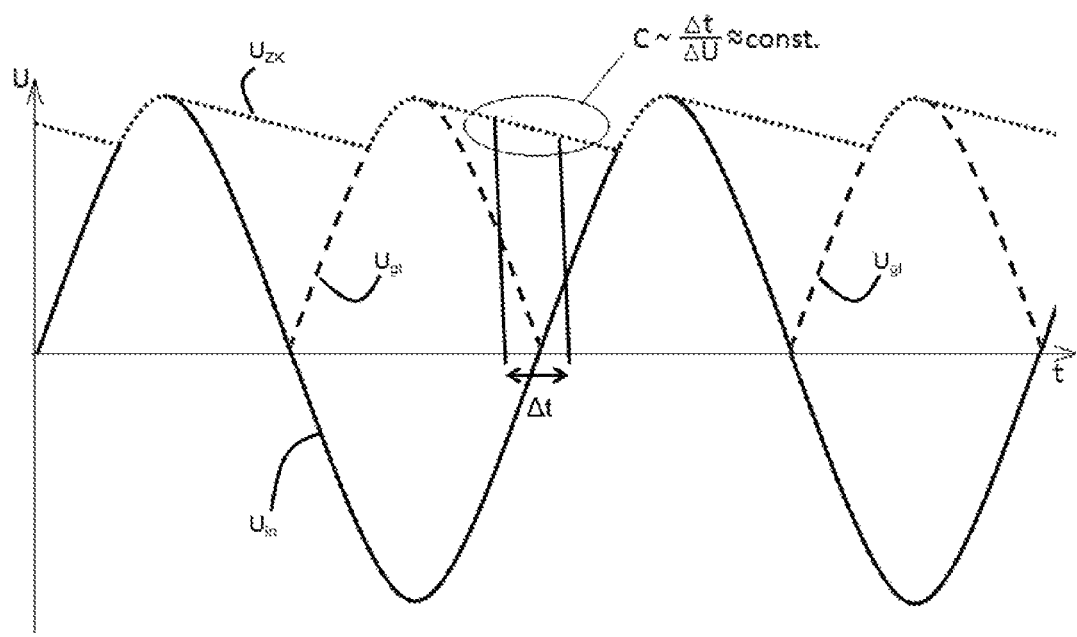

(51) Int. Cl.
*G01R 31/00* (2006.01)
*G01R 31/01* (2020.01)

(58) Field of Classification Search
USPC .......................................................... 324/548
See application file for complete search history.

(56) References Cited

FOREIGN PATENT DOCUMENTS

| | | |
|---|---|---|
| DE | 102010023017 A1 | 12/2011 |
| DE | 102012215963 A1 | 3/2014 |
| DE | 102013216575 A1 | 2/2015 |
| EP | 2418389 A2 | 2/2012 |
| JP | 2006009699 A | 1/2006 |
| WO | 2017036470 A1 | 3/2017 |

* cited by examiner

METHOD AND ASSESSMENT UNIT FOR DETERMINING THE REMAINING SERVICE LIFE OF A CAPACITOR, AND SYSTEM

This application is a national stage entry under 35 U.S.C. 371 of PCT Patent Application No. PCT/DE2018/200099, filed Nov. 5, 2018, which claims priority to German Patent Application No. 102017221096.6, filed Nov. 24, 2017, the entire contents of each of which is incorporated herein by reference.

This disclosure relates to a method and an assessment device for determining the remaining service life of a capacitor, wherein the capacitor is charged and discharged at least once. This disclosure further relates to a system comprising such an assessment device as well as a circuit having at least one capacitor to be assessed.

In practice, it is of regular importance to estimate or determine the remaining service life of a component or assembly. This may be important whenever a failure would lead to consequential damage, as is the case, for example, in thermally critical applications. For example, if the cooling system, or part of such a system, fails in a server room, it can cause overheating and downtime, or even destruction of servers and other hardware. The cooling of other complex and/or expensive electronic systems is similarly important. In such application scenarios, it is useful to see an impending failure early, so that the component at risk of failure can be replaced in time prior to the failure.

For example, multiple components and assemblies limiting service life are present in inverters, such as those used in the control of electric motors, for example EC (Electronically Commutated) motors. Semiconductors (mainly in power amplifiers or in optocouplers) and capacitors (mainly in the case of electrolytic capacitors in the intermediate circuit or in switching power supplies) are most at risk of failure. For example, capacitors are subject to high temperature-dependent and load current-dependent aging, which is why their service life can vary greatly.

JPH7-92213A discloses a method that allows the service life of a capacitor to be estimated. For this purpose, the internal temperature $T_C$ of the capacitor is estimated using the formula $T_C = T_0 + K \cdot (I_C / I_S)$. Therein, $T_0$ is the ambient temperature, $I_C$ is the current through the capacitor and $I_S$ the permissible ripple current, K is a scaling factor that depends on the type of capacitor. All estimated $T_C$ are added up. If the sum exceeds a predetermined value, a decision is made in favor of the end of the service life. The disadvantage of this method is that the current value of the sum depends on a variety of summands. As a result, errors, especially measurement or quantization errors, propagate significantly.

A method for monitoring service life is known from DE 10 2012 105 198 A1, which method can be used to estimate the remaining service life of an electrolytic capacitor. The calculations are based on the formula:

$$L_X = L_0 \cdot 2^{\frac{T_0 T_X}{10}} \cdot 2^{\frac{\Delta T_m - \Delta T_m (I_{ripple}/I_0)^2}{k}}$$

The following symbols are used therein:
$L_X$ the expected current service life,
$L_0$ specified service life according to the data sheet,
$T_0$ a predetermined maximum operating temperature (e.g. 105° C.),
$T_X$ v the respective current ambient temperature,
$\Delta T_M$ a constant, the so-called inside temperature increase,
$I_{ripple}$ current ripple current at the intermediate circuit capacitor,
$I_0$ specified ripple current according to the data sheet and K a constant, the so-called acceleration factor.

The disadvantage of this method is that values must be recorded and calculated continuously. Herein, the complex and elaborate calculations only indicate a statistical probability of failure without being able to assess the actual state.

EP 1 338 874 A1 determines the remaining service life of an electrolytic capacitor in a similar way. The basis here is a somewhat simplified form of the previously mentioned formula. Therein, a strong focus is directed at determining the capacitor temperature.

DE 10 2004 035723 A1 assumes that the evaporation of electrolyte fluid of the capacitor causes the capacitor to age and that the level of the core temperature is a crucial factor influencing the degree of evaporation. Therefore, the remaining service life is estimated using a thermal model based on a simplified form of the previously mentioned formula and further calculation stages. This method also only allows for statistical statements.

A method for determining the health status of a capacitor in a power inverter is known from US 2009/072982 A1. For this purpose, the ripple voltage in the DC intermediate circuit is monitored and compared with an initial value of the ripple voltage. A decreasing capacitance of the electrolytic capacitor due to aging will cause an existing ripple voltage to be filtered out to a lesser degree. The level of existing ripple is used to draw conclusions regarding the state of the capacitor. The disadvantage of this is that, while it is true that the filter characteristic of the intermediate circuit capacitor contributes significantly to the reduction of the ripple, the expression of the ripple does not depend solely on the capacitance of the intermediate circuit capacitor, but on other factors as well.

The problem underlying this disclosure is to design and further develop a method, an assessment device and a system of the aforementioned type in such a way that the remaining service life of a capacitor can be determined with little effort.

According to the disclosure, the preceding problem is solved by the characteristics of claim 1. According to these, the method includes the following stages:
Measuring a voltage change across the capacitor during a discharging time,
determining a discharging current during the discharging time,
determining an actual capacitance of the capacitor on the basis of the
voltage change, the discharging current and the discharging time,
determining a corrected capacitance of the capacitor from the actual capacitance based on an error correction, wherein influences of the temperature on the capacitance of the capacitor are corrected during the error correction, and
determining the remaining service life on the basis of a difference between the corrected capacitance and an initial capacitance of the capacitor.

With regard to an assessment device, the preceding problem is solved by the characteristics of claim 12. According to these, the assessment device includes:
a voltage input configured to receive a measured value of a voltage change across the capacitor during a discharging time, a current input configured to receive a measured value of the discharging current, wherein the discharging current has been identified during the discharging time, a capacitance detecting device for detecting an actual capacitance of the capacitor on the basis of the voltage change, the discharging current and the discharging time, a correcting device configured to detect a corrected capacitance of the capacitor from the actual capacitance based on an error correction, wherein influences of the temperature on the capacitance of the capacitor are corrected during the error correction, and an evaluation device for determining the remaining service life on the basis of a difference between the corrected capacitance and an initial capacitance of the capacitor.

With regard to a system, the aforementioned problem is solved by the characteristics of claim 13.

In the method according to the disclosure, it was first recognized that extremely elaborate and/or repetitive estimation methods are not necessary to be able to assess the remaining service life of a capacitor. Rather, it is even comparatively easy, according to the disclosure, to precisely assess the remaining service life and/or the end of service life of a capacitor based on usually already existing measured values. Over the service life of a capacitor, the leakage current will increase and the ESR (Equivalent Series Resistance) and capacitance will decrease. Therefore, determining the current capacitance facilitates an assessment regarding the remaining service life of the capacitor. It is true that the capacitance of a capacitor, which is to be measured in a circuit during operation, depends on the respective operating conditions, such that it is difficult to assess the remaining service life in this way. However, the capacitance can still be used as a measure of the remaining service life if the influences of the operation of the capacitor are corrected by an error correction. In this context, temperature is the most important quantity that affects the capacitance of the capacitor. Therefore, according to the disclosure, a measured capacitance value is converted to a reference operating state based on error correction. The corrected capacitance thus determined can easily be compared with an initial capacitance of the capacitor, such that conclusions can be drawn from this comparison regarding the aging of the capacitor. This in turn allows the remaining service life of the capacitor to be determined.

The capacitance of a capacitor can be calculated based on the differential equation $$i = C \frac{du}{dt}$$

This results in exponential voltage and current curves in both the charging and discharging paths. Both the charging process and the discharging process of the capacitor could be used to determine the capacitance. However, due to the influence of the charging current during the charging process, determining the capacitance during charging would become more complex. Therefore, the discharging path is used in the method according to the disclosure.

Assuming a linear or quasi-linear progression of the discharging curve at a given time simplifies the equation to the following:

$$I = C \frac{\Delta U}{\Delta t}$$

This results in the equation:

$$C = I \frac{\Delta t}{\Delta U}$$

Thus, the actual capacitance of a capacitor can be calculated based on a voltage change $\Delta U$ during a discharging time $\Delta t$ and the discharging current I flowing during this process.

Therefore, a voltage change $\Delta U$ across the capacitor during a discharging time $\Delta t$ is measured first in the method according to the disclosure. At the same time, a discharging current I is determined during the discharging time $\Delta t$. In a further stage, the actual capacitance $C_{measured}$ of the capacitor is calculated on the basis of the voltage change $\Delta U$, the discharging current I and the discharging time $\Delta t$.

Since, as previously explained, the actual capacitance $C_{measured}$ of the capacitor depends on the operating conditions of the capacitor, a corresponding error correction is conducted in a next stage. By means of this error correction, a corrected capacitance $C_X$ of the capacitor is determined, at which at least one value having an influence on the capacitor's capacitance is eliminated. Thus, the corrected capacitance is a value that is calculated back to a reference value with respect to the corrected influencing value. Since the temperature of the capacitor has an important influence on the actual capacitance of the capacitor, the influence value "temperature" is corrected during the error correction according to the disclosure. During this error correction, the measured actual capacitance $C_{measured}$ is transposed to a predetermined reference temperature. It is largely irrelevant which value is selected for the reference temperature. The prerequisite is that the temperature is within the operating range of the capacitor. For example, a reference temperature of 1° C., 20° C. or 30° C. is conceivable, just to give a few possible examples. Since a reference temperature of 20° C. is very often used in data sheets of capacitors, the method according to the disclosure calculates back to the reference temperature of 20° C.

The error correction results in capacitance values that are comparable to each other regardless of the current operating condition. In this way, it can be determined to what extent the capacitance value has already changed over the course of the service life of the capacitor so far. In a further stage, a difference is calculated between the corrected capacitance $C_X$ and an initial capacitance $C_0$ of the capacitor. The initial capacitance $C_0$ herein represents the capacitance value of the capacitor, which was present at the beginning of the capacitor's service life. For capacitors, for example electrolytic capacitors, the capacitance value is relatively constant at the beginning of their service life and decreases significantly faster toward the end of their service life. Nevertheless, the capacitance value of electrolytic capacitors decreases continuously during their service life. This means that a measure of the remaining service life of the capacitor can be derived from the difference between the corrected capacitance $C_X$ and the initial capacitance $C_0$. If the corrected capacitance $C_X$ differs from the initial capacitance $C_0$ only by a few percent, it follows that the remaining service life is relatively long. However, if the corrected capacitance differs from the initial capacitance by a double-digit percentage, the capacitor is at risk of imminent failure. A service life curve of the capacitor can be used to determine the remaining service life. Although there will be variances of the service lives of capacitors, it will still be possible to get a fairly precise picture of the expected remaining service life in this manner.

In principle, it is irrelevant for the method according to the disclosure of which type the capacitor is. However, the method assumes that the capacitance of the capacitor undergoes a continuous change over the service life of the capacitor in relation to an initial capacitance. It may be advantageous if the capacitance value declines more steeply toward the end of the service life than at the beginning of the service life. This makes it possible to precisely detect when the end of service life is reached. The method according to the disclosure may be used in connection with the determination of the remaining service life of electrolytic capacitors.

The method according to the disclosure makes it possible to assess a capacitor during operation. The type of circuit in which the capacitor to be assessed is installed is of secondary importance. It is only important that the capacitor is charged and discharged at least once during the operation of the circuit. This charging and discharging, performed at least once, must be conducted during the determination of the actual capacitance. To simplify the determination of the remaining service life, it is advantageous if the capacitor is charged and discharged repeatedly, thus making it possible to determine the remaining service life repeatedly. Particularly favorable conditions are present when the capacitor is charged and discharged periodically, because this makes it possible to trigger the measurements and/or calculations. In this context, the capacitor does not need to be completely charged or completely discharged. The method only assumes that an at least partial charging and discharging of the capacitor is performed. Especially with regard to a simple calculation in the linear or quasi-linear range of the capacitor, it is favorable even to only partially discharge the capacitor.

However, the method according to the disclosure may be used in a circuit that has a DC intermediate circuit, wherein the capacitor to be assessed would then be used in the intermediate circuit as a buffer capacitor. Such a circuit with a DC intermediate circuit may be formed, for example, by an inverter circuit, which is operated on an energy supply network with an AC voltage and which emits an AC voltage at the output. Such inverters are used, for example, in the operation of an electric motor. According to an embodiment, the circuit with intermediate circuit is an inverter for an EC motor.

Even if the text above refers to the determination of the capacitance of a capacitor, the method according to the disclosure can also be used for multiple interconnected capacitors. It does not matter in this context whether the capacitors are connected in parallel or/and in series. In such interconnections of several capacitors, the total capacitance of the capacitors would be assessed. The only important factor here is that the capacitors change in a similar way over the course of their service life, for example that they experience a comparable reduction in capacitance. Furthermore, the capacitors should be subject to similar stresses, for example, exposed to similar temperatures. In such a case, the remaining service life of the entire interconnection of the capacitors would be determined by the method according to the disclosure. The initial capacitance used to compare a corrected total capacitance would then be the capacitance that the interconnected capacitors have when they are put into operation at the beginning of their service life.

Since the remaining service life of the capacitor will depend on its respective operating conditions, various assumptions can be made when calculating the remaining service life. It is conceivable, for example, to extrapolate the current operating conditions. This would make it possible to formulate a statement: If the capacitor continues to operate under the current conditions, a failure is expected in x hours. However, it is also conceivable to extrapolate the remaining service life based on an average of operating conditions in an elapsed period of time, for example in the previous 7 days. However, it is also conceivable to assume reference conditions for the operation of the capacitor. The latter approach may have advantages in that the remaining service life does not need to be adjusted further.

In addition to temperature, other influences also have an effect on the actual capacitance of a capacitor during its operation. Such influences are, for example, the frequency of the load current during the measuring period, the voltage level across the capacitor during the measuring period (ripples of the voltage can usually be neglected, especially in the case of a partial discharge of the capacitor) and the load current level during the measuring period. Therefore, in a further development of the disclosure, the influence of at least one of these further influences is corrected in addition to the temperature. In order to achieve a corrected capacitance, all four aforementioned influencing variables can be corrected in an error correction.

The type of dependence of the capacitance of a capacitor usually depends on the type of capacitor and the specific internal structure of the capacitor. All instances of a specified model of a capacitor behave in a similar way when exposed to a changing influencing variable. Therefore, in another further development, the error correction, or the error corrections, is/are carried out on the basis of a characteristic curve of the capacitor. Such a characteristic curve can usually be obtained from the data sheet of the capacitor. Alternatively, this characteristic curve can also be created as an example for a capacitor of a certain design. For the error correction, the characteristic curve can be stored in various forms. For example, a value table could be provided for the characteristic curve, wherein values that fall between two values of the table might be interpolated. However, in order to achieve an efficient method, the characteristic curve of the capacitor may be approximated in several subsections. As the characteristic curves are usually relatively simple, an approximation can be realized very well in two to three subsections. Herein, the subsections may merge into each other continuously. Subsections can be described by first or second order polynomial functions. In this way, a calculation rule for error correction can be stored very efficiently and the calculation of the corrected capacitance can be performed very easily.

A characteristic curve that is (partially) approximated can also be used with regard to the service life curve, which can be used for determining the remaining service life. This makes the calculation much simpler.

A wide range of methods can be used to detect the temperature of the capacitor. It is conceivable to measure the temperature of the capacitor directly at the capacitor. This can be done by a sensor element that is in direct contact with the capacitor. Alternatively, it would be conceivable to integrate a temperature sensor into the capacitor. However, an ambient temperature of the capacitor may be measured and calculated back to the temperature of the capacitor. This is feasible because it is known how the temperature within a capacitor behaves under a known load and at a known ambient temperature. The voltage across the capacitor, the discharging current through the capacitor and/or the frequency of the discharging current can be used to estimate the temperature of the capacitor based on the ambient temperature around the capacitor. In this way, the temperature of the capacitor can be estimated relatively accurately without the need for a dedicated temperature sensor in the capacitor. Various temperatures can be derived, such as the average temperature of the capacitor or the core temperature. The choice of temperature to use in this process mainly depends on the temperature relative to which the error correction for temperature influences is performed. For example, if the characteristic curve of the capacitor used for an error correction is based on the average temperature of the capacitor, the measured or deduced temperature should also be the average temperature of the capacitor.

The decision as to when the end of a capacitor's service life is approaching or has been reached depends on a number of factors. These factors include, for example, the type of capacitor, the design of the capacitor, or the minimum capacitance value that the capacitor must maintain at a minimum to function in the circuit surrounding it. Therefore, it may be advantageous to base the determination of the end of the service life on a predetermined proportion by which the corrected capacitance has sunk below the initial capacitance. This predetermined value may be set to a value between 15% and 50%. The predetermined proportion may be selected to be between 15% and 30%. In a further embodiment, the predetermined proportion may be selected to be 20%.

The selection of the discharging time for measuring a voltage change also depends on several factors. It is important for the selection of the discharging time that approximately no charging current flows into the capacitor and thus no significant charging of the capacitor takes place. Therefore, the discharging time $\Delta t$ should be sufficiently short for the measurement to be completed in time before the start of the next periodic charging. For example, if the capacitor is arranged in a DC intermediate circuit, the charging phases depend on the frequency of the alternating voltage present at the input of the circuit. The discharging time $\Delta t$ of the input voltage should therefore be selected to be small compared to the frequency of the input voltage. It could be conceivable, for example, that $\Delta t$ is less than 20% of the periodic length of the input voltage. To simplify the calculation of the actual capacitance, the discharging time $\Delta t$ may also be selected such that the capacitor is discharged quasi-linearly during the discharging time $\Delta t$. If the capacitor is an intermediate circuit capacitor, this is usually the case during a wide range of the discharging phase. Therefore, this further development can be implemented, especially for circuits with a DC intermediate circuit.

Various implementations are also conceivable for determining the voltage change across the capacitor during the discharging time. The voltage across the capacitor may be measured at the beginning of the discharging time $\Delta t$ and at the end of the discharging time $\Delta t$, and the voltage change $\Delta U$ is calculated from these two voltage values. Especially in inverters, the voltage across the capacitor, namely the intermediate circuit DC voltage, already is known, as this voltage is required for regulating the power stage. In this respect, especially when using the method according to the disclosure in an inverter, it may be easy to determine the voltage values and thus the voltage change $\Delta U$.

In order to largely exclude boundary effects when determining the initial capacitance, it is recommended to determine the initial capacitance when the capacitor or the circuit surrounding the capacitor is first put into operation. In this context, it may be advantageous to proceed as in determining the corrected capacitance. This means that here, too, a voltage change $\Delta U$ is measured, the discharging current I is detected and, combined with the selected discharging time $\Delta t$, an actual capacitance $C_{measured}$ is determined. Subsequently, an error correction is performed, which at least takes into account the temperature of the capacitor. In order to achieve a precise initial capacitance, it is recommended to include additional influencing variables in the error correction. In this context, it is also conceivable that, in order to eliminate possible measurement errors, the determination of the initial capacitance is carried out multiple times and that an average value is formed from the multiple determined values for the initial capacitance and stored as the value of the initial capacitance $C_0$. This would reduce the influence of measurement errors. Furthermore, it is conceivable that the determination of the initial capacitance is performed only after the expiration of a burn-in period, i.e., that the circuit in which the capacitor is arranged is operated for a burn-in period, for example 10 hours, and that the initial capacitance is determined only then.

The method according to the disclosure can be performed by an assessment device according to the disclosure. This assessment device includes at least a voltage input, a current input, a capacitance detecting device, a correcting device, and an evaluation device. The voltage input is configured to receive a measured value of a voltage change $\Delta U$ across the capacitor during a discharging time $\Delta t$. This voltage change can be formed in various ways, regarding which reference is made to the explanations listed above. The current input is designed in such a manner that a measured value of the discharging current, which has been detected during the discharging time $\Delta t$, is entered into it. The capacitance detecting device is configured to detecting an actual capacitance of the capacitor on the basis of the voltage change $\Delta U$, the discharging current I and the discharging time $\Delta t$. The correcting device performs the error correction based on the actual capacitance and thus determines a corrected capacitance $C_X$. The evaluation device determines a remaining service life $L_r$ of the capacitor on the basis of a difference between the corrected capacitance $C_x$ and an initial capacitance $C_0$ of the capacitor. This measure of the remaining service life of the capacitor, which is determined by the evaluation device, can be used in a variety of ways. It is conceivable to generate a warning signal if the difference exceeds a predetermined value. However, it is also conceivable to save this value for further processing, for example to generate a chronological sequence or to access the value when an updated value is calculated. However, the assessment device may have an output, based on which the measure of remaining service life determined by the assessment device can be emitted.

The assessment device and its elements can be implemented in a variety of ways. In most cases, however, an implementation will be conducted through a combination of software and hardware. For example, this could mean that the capacitance detecting device is implemented by program code that is processed on a microcontroller or other processor. Even the voltage input or the current input can be implemented by software, for example by a storage device into which the corresponding voltage or current values are stored. Corresponding implementations are known in practice.

The assessment device can be arranged in a system consisting of a circuit and an assessment device. This circuit would include at least one capacitor, whose remaining service life is to be determined by the assessment device.

This capacitor is charged and discharged at least once during the operation of the circuit. It should be noted again that the charging and discharging does not need to be complete; rather, a partial discharge can and usually will take place, such that a certain residual charge always remains in the capacitor during the operation of the circuit. It should also be noted that a single charging and discharging of the capacitor would in principle suffice to determine the remaining service life of the capacitor. However, it is preferable that the capacitor is charged and discharged repeatedly, such that a repeated determination of the remaining service life becomes possible. The capacitor may be charged and discharged periodically.

In an embodiment of this circuit, the circuit includes a DC intermediate circuit in which at least one capacitor is used as a buffer capacitor. In a further development of the system according to the disclosure, it includes an intermediate circuit monitoring device, which measures the voltage across the capacitor and enters it into the voltage input of the assessment device. The measured voltage across the capacitor may be the DC voltage applied to the intermediate circuit.

A current detection device may be provided in a further development of the system for determining the discharging current I. This current detection device may include a current sensor for measuring the discharging current, which directly measures the flowing discharging current. However, it is also conceivable that the current detection device calculates the discharging current from other measured values that are already present within the circuit. If, for example, the circuit is an inverter circuit, the power which is output by the circuit is already known in many cases. The discharging current can be calculated from this output power as well as from the voltage value present at the capacitor at the respective time. A root mean square (RMS) value is likely to be used for power and voltage, especially for a measurement in the quasi-linear range of the discharge. In this way, the discharging current can be determined without additional sensors.

The system may have a frequency detection device for measuring a frequency of the discharging current, Here again, the frequency of the discharging current can be derived from values already present in the circuit. Thus, the frequency detection device could derive the frequency of the charging current from a frequency of a control signal for a power stage of the circuit. Especially in the case of inverters, the frequencies of a control signal are known already.

The system can also have an output device based on which information about the determined remaining service life can be emitted. In an embodiment, the output device can be made of a signal light, for example an LED (Light Emitting Diode). The signal light would be activated when the end of the remaining service life is reached. However, it is also conceivable that the output device emits concrete values, such as a percentage.

Figure 2:
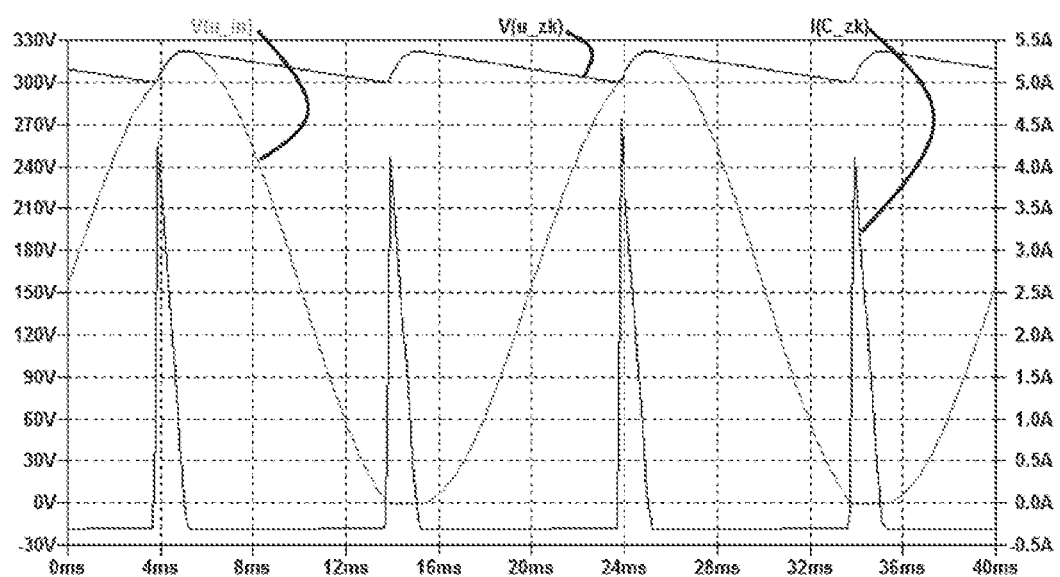

There are various options, then, to design and further develop the teaching of this disclosure in an advantageous manner. For this purpose, we refer, on the one hand, to the claims subordinated to the dependent claims and, on the other hand, to the following explanation exemplary embodiments of the disclosure on the basis of the drawing. In connection with the explanation of the exemplary embodiments of the disclosure on the basis of the drawing, embodiments and further developments of the teaching are explained in general terms. The drawings show:

FIG. 1 A diagram with typical voltage curves at a capacitor to be assessed in a DC intermediate circuit FIG. 2 A diagram with a current curve with an applied voltage according to FIG. 1.

Figure 3:
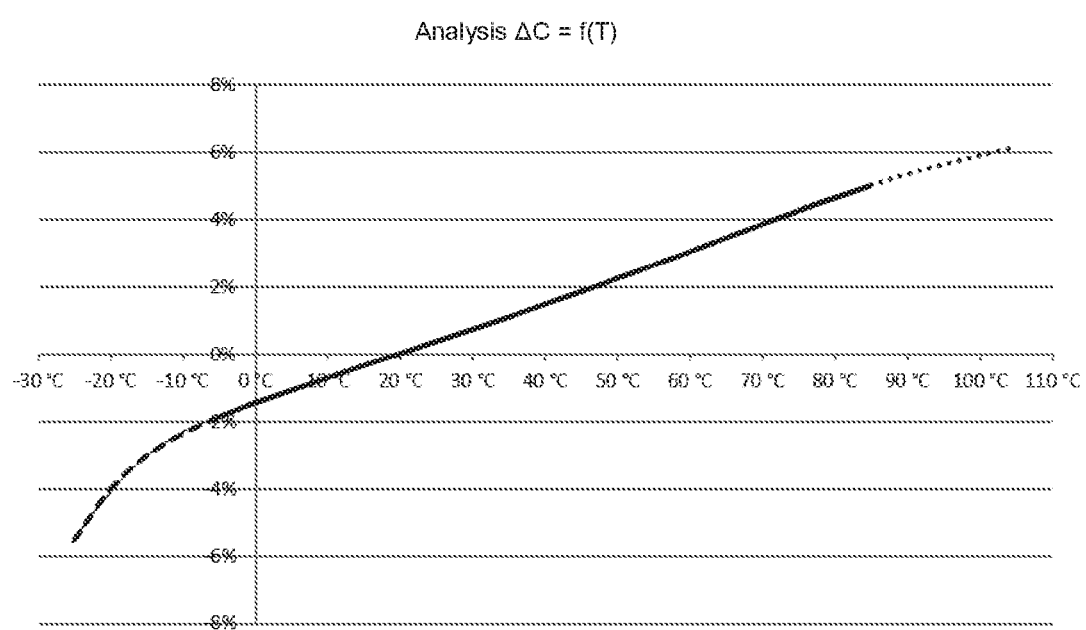
Figure 4:
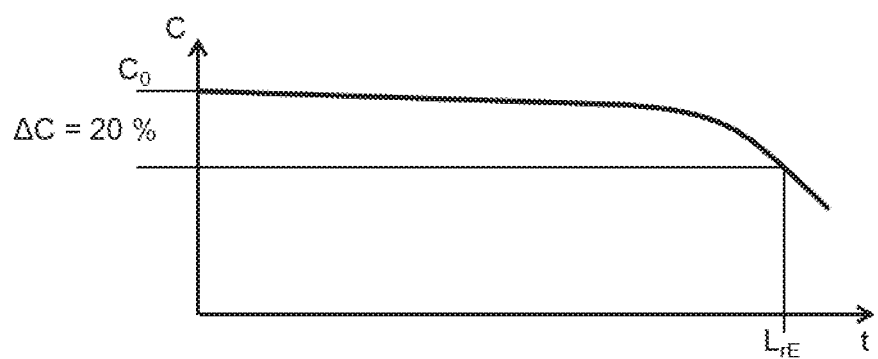
Figure 5:
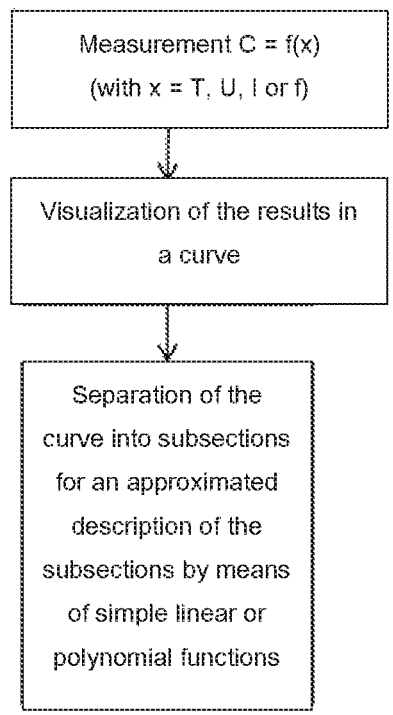
Figure 6:
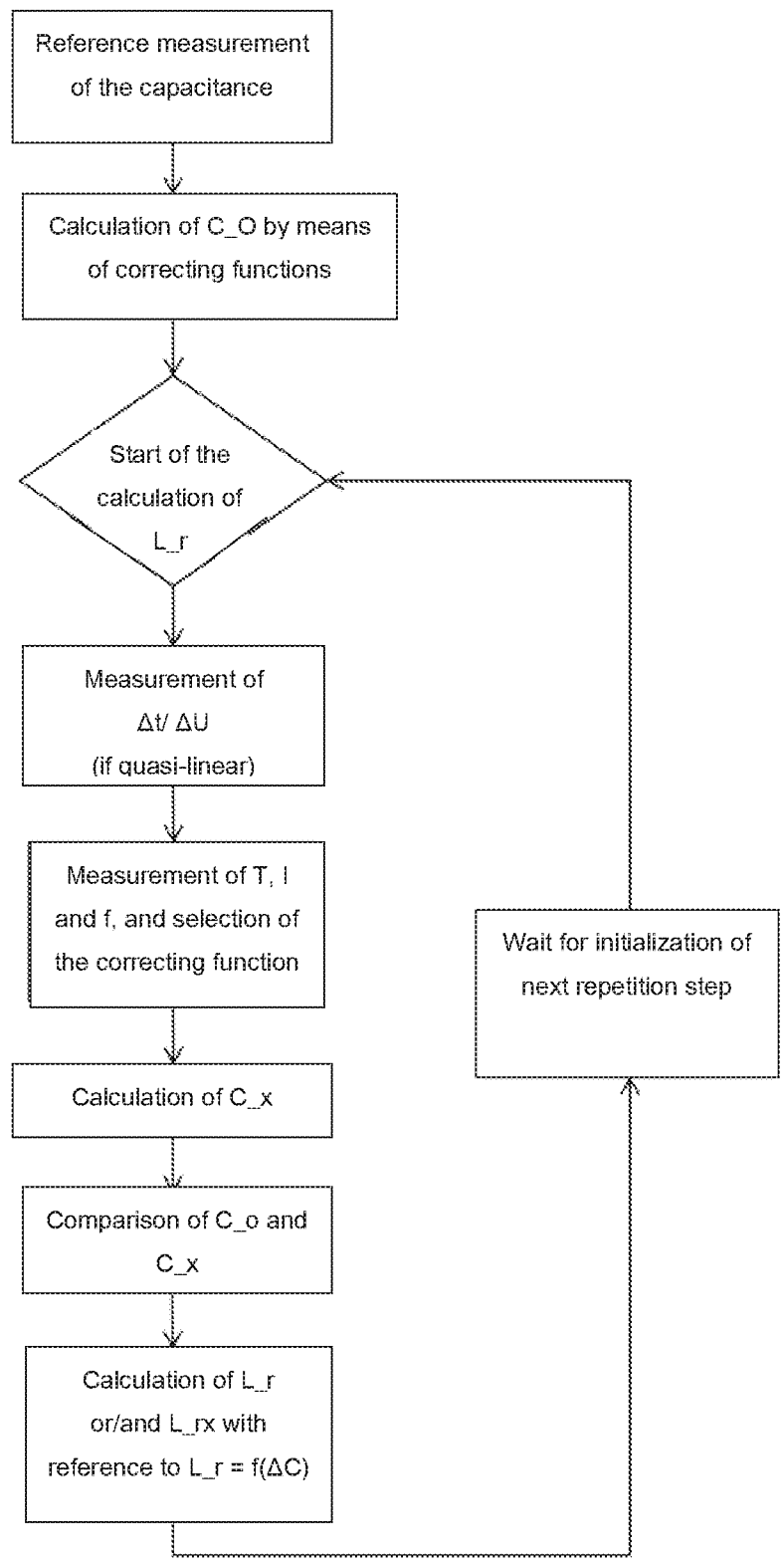

FIG. 3 A diagram with an approximation of a characteristic curve of a capacitor with respect to the change in capacitance caused by temperature FIG. 4 A diagram with a service life curve of a capacitor FIG. 5 A flowchart with an exemplary sequence for generating a characteristic curve of a capacitor approximated by subsections FIG. 6 A flowchart of an exemplary embodiment of a method according to the disclosure FIG. 1 shows a diagram with typical voltage curves, as may be present at a capacitor in a DC intermediate circuit. Shown is an application in which a single-phase AC voltage at the input of the circuit is rectified by a bridge rectifier. The progression of the input voltage $U_{in}$, is shown as a solid sinusoidal line. By rectifying the input voltage, the voltages represented in the negative area of the voltage are converted to positive voltages, which in FIG. 1 is represented by dotted sinusoidal half waves. This pulsating, rectified voltage $U_{gl}$ is applied to a capacitor. As soon as the applied voltage exceeds the current value of the voltage across the capacitor, a charging current flows into the capacitor, which charges the capacitor. As soon as the rectified sine voltage assumes a voltage below the voltage across the capacitor, the capacitor is gradually discharged. The resulting voltage curve $U_{ZK}$ is represented by a dotted line. The discharging of the capacitor is performed according to an exponential function, wherein the discharging curve assumes an approximately linear course at the beginning of the discharging process. The discharging time $\Delta t$, during which the voltage difference $\Delta U$ is measured, is selected from this range. The range in which this is possible is represented by an ellipse in FIG. 1, In this range, the capacitance is proportional to $\Delta t/\Delta U$ and is approximately constant. An example of a possible discharging time for the determination of the actual capacitance is represented as $\Delta t$. The voltage is measured at the beginning of the discharging time $\Delta t$ and at the end of the discharging time $\Delta t$, and the voltage difference $\Delta U$ is calculated from these values.

FIG. 2 shows a progression of an exemplary current I (C_ZK). In addition, the input voltage $U_{in}$ and the voltage across the capacitor $U_{ZK}$ are marked in FIG. 2. The curve shows that the current rises briefly during the charging phases and otherwise runs approximately constant at about −0.3 A. This means that the capacitor is charged during the short current peaks, while the capacitor is discharged during the approximately horizontal areas (in this example, via a resistive load).

FIG. 3 shows an exemplary progression of a change in capacitance over temperature. The temperature of 20° C. is selected as a reference temperature. As the temperature rises, so does the capacitance, and as the temperature drops, so does the capacitance. For example, at a temperature of about 70° C., the capacitance value would increase by almost 4% over the capacitance value at 20° C., The temperature characteristic curve of the capacitor displayed in FIG. 3 is approximated in three subsections. A first subsection runs from −25° C. to −5° C., a second subsection between −5° C. and +85° C. and a third subsection above +85° C. The first subsection is represented by a dashed line, the second subsection by a solid line, and the third subsection by a dotted line. The first and third parts can be described by a second-degree polynomial function, while the second part can be described by a first-degree polynomial function. Using the exemplary characteristic curve approximation shown in FIG. 3, the capacitance corrected for the influence of temperature, for example, can be calculated in the first subsection with the formula $$C_{x,T,-25°\ C.\ \ldots\ -5°\ C.} = (1-7\cdot10^{-5}\cdot T^2 - 2\cdot10^{-4}\cdot T - 0.0186) \cdot C_{measured}$$

and in the second subsection with the formula $$C_{x,T,-5°\ C.\ \ldots\ -85°\ C.} = (1+8\cdot10^{-4}\cdot T - 0.0151)\cdot C_{measured}$$

As the third portion above +85° C. is usually irrelevant due to a very rapid aging of the capacitor, a formulaic description of it is omitted here. It is clear that this approximation can be used to calculate a capacitance corrected for temperature influence quickly and with little effort. In this manner, a capacitance measured at a given temperature will be corrected to a reference temperature value, here 20° C. The adjusted capacitance is then corrected for the influence of the temperature.

If an error correction additionally is to be performed according to other influencing factors, this can be done accordingly. This additional error correction can also be performed based on characteristic curves formed section by section, Such an additional error correction would then include the capacitance value calculated in the previous correction stage in the calculation. After all error correction stages are performed, the corrected capacitance $C_X$ results.

FIG. 4A shows a diagram with a service life characteristic curve of a capacitor. This, too, may include an approximated characteristic curve (in sections). The initial capacitance is $C_0$, which decreases over the course of the capacitor's operating life. It is assumed that the capacitor is always operated under similar ambient conditions. If the capacitor is operated in such a way that the operating conditions lead to increased aging, for example in the range with high temperatures of the capacitor, the characteristic curve would be shortened in the time direction t. Under operating conditions causing less aging, the characteristic curve would be extended in the time direction t. It is clear that the capacitance is hardly reduced over a relatively long period of the service life. The capacitance only decreases significantly in the last quarter of the service life. However, it also is clear that the characteristic curve moves continuously and steadily down toward lower capacitance values. If the end of the service life $L_{rE}$ is defined by a 20% drop in actual capacitance below the initial capacitance $C_0$, the result is an end of service life $L_{rE}$ as marked in FIG. 4. Thus, the inventive method can be used to form an assessment about the remaining service life $L_r$ at any time. The only value that must be known in addition to the current measured values is the initial capacitance $C_0$. This shows that no repetitive procedures and no complex calculations are required.

FIG. 5A shows a flowchart with an exemplary sequence for generating a characteristic curve approximated sector-by-sector of a capacitor. In a first stage, the capacitance of the capacitor is measured depending on the temperature T, the voltage U, the current I or the frequency f. For this purpose, the value whose dependency is to be determined is changed continuously or in discrete stages, while the other quantities are kept approximately constant. In this context, it is recommended to keep the other values at predetermined reference values. For example, if a characteristic curve for the dependence of the capacitance on the temperature is to be measured, the temperature is changed and the voltage U, the current I and the frequency f are kept largely constant. For example, the temperature can be changed by single degrees or in jumps of 5° C. The selection of the measurement intervals depends on the desired accuracy and the maximum measurement duration for capturing the characteristic curve.

In a next stage, the measurement results are visualized. Values that fall between two measured values can be interpolated, for example by linear interpolation. This stage is especially necessary if the subsections and possibly the approximation are to be done manually. Otherwise, this stage can also be skipped.

In a further stage, the curve generated from the measured values is divided into subsections and an approximation of the subsections is determined based on a linear or polynomial function. In this process, a polynomial function of no higher than second order may be used. The determination of the subsections and the approximations can be done manually. However, automated methods are also known that can determine such approximations.

FIG. 6 shows a flowchart, which represents an exemplary embodiment of a method according to the disclosure. At the beginning of the process, reference measurements of the capacitance are performed as a first stage. The capacitor is already installed in the circuit. In a next stage, the initial capacitance $C_0$ is calculated from these measurements. These stages can be repeated several times, wherein an average of all previously determined initial capacitance values would then be formed at the end of the repetitions.

The next stage is to calculate the remaining service life $L_r$. For this purpose, a voltage change $\Delta U$ of the voltage across the capacitor is measured over a discharging time $\Delta t$ in the quasi-linear range of the discharging phase of the capacitor. For this purpose, the intermediate circuit voltage is measured at the beginning and end of the discharging time $\Delta t$, and the voltage change $\Delta U$ is determined as the difference between the two voltage values. Furthermore, the temperature T, the discharging current I and the frequency of the discharging current are determined or measured. In this case, corrections are to be performed for temperature dependence, frequency dependence, voltage dependence, and current dependence. For this purpose, a characteristic curve is available for each influencing variable, which is approximated in sections. Depending on the measured value for temperature, frequency, voltage or current, the appropriate subsection of the respective characteristic curve must be selected. For example, if a temperature of 43° C. was measured, the second subsection should be selected—assuming the use of the characteristic curve in FIG. 3.

In a next stage, the corrected capacitance $C_X$ would then be calculated. For this purpose, the four error corrections are performed one by one, wherein the corrected capacitance value of the previous correction is included in the current error correction. For example, if a correction for the temperature influence is performed, followed by a correction for the frequency influence, the capacitance value $C_{x,T}$ adjusted for the temperature influence would be entered as a value to be corrected in the correction for the frequency influence.

In a further stage, the corrected capacitance $C_X$ is compared with the initial capacitance $C_0$, and the deviation of the two values from each other is determined. Usually, this deviation will be given as a percentage. This deviation is then used to calculate the remaining service life $L_r$ and/or $L_{rx}$, based on a service life characteristic curve. The remaining service life $L_r$ represents the expected remaining service life if the capacitor were to continue to operate under current operating conditions. The remaining service life $L_{rx}$ is converted to reference operating conditions. After successfully calculating the remaining service life, the process rests until the initialization of the next repetition and then restarts the stages for calculating the remaining service life. In this context, the repetition can be retriggered by the expiration of a certain amount of time, for example.

With regard to further advantageous embodiments of the teaching according to the disclosure, reference is made to the general part of the description as well as to the attached claims, in order to avoid repetition.

Finally, it must be stated expressly that the exemplary embodiments described above merely serve to discuss the claimed teaching, but do not limit the same to these exemplary embodiments.

LIST OF REFERENCE SYMBOLS

T Temperature of the capacitor
$\Delta t$ Discharging time (during which the measurement takes place)
$\Delta U$ Voltage change across the capacitor during a discharging time $\Delta t$
I Discharging current during the discharging time $\Delta t$
f Frequency of the discharging current I
$C_{measured}$ Measured capacitance
$C_x$ Corrected capacitance
$C_0$ Initial capacitance
$L_r$ Remaining service life (under the current operating conditions)
$L_{rx}$ Remaining service life (under reference boundary conditions)
$L_{rE}$ End of service life
$U_{in}$ Input voltage to the circuit
$U_{gl}$ Rectified input voltage
$U_{ZK}$ Voltage across the capacitor/intermediate circuit voltage

The invention claimed is:

1. A method of determining a remaining service life of a capacitor, wherein the capacitor is charged and discharged at least once, the method comprising:
   measuring a voltage change across the capacitor during a discharging time;
   determining a discharging current during the discharging time;
   determining an actual capacitance of the capacitor based on the voltage change, the discharging current, and the discharging time;
   determining a corrected capacitance of the capacitor based on the actual capacitance by determining an error correction, wherein influences of a temperature on the capacitance of the capacitor are corrected by the error correction; and
   determining the remaining service life based on a difference between the corrected capacitance and an initial capacitance of the capacitor.

2. The method according to claim 1, wherein determining the corrected capacitance further comprises determining an error correction for the capacitance with regard to an influence of one or more of:
   a frequency of the discharging current during the discharging time;
   a voltage across the capacitor during the discharging time; and the discharging current during the discharging time.

3. The method according to claim 1, wherein one or more error corrections are carried out based on a characteristic curve of the capacitor,
   wherein the characteristic curve describes a dependence of the capacitance of the capacitor on a respective corrected influencing variable.

4. The method according to claim 3, wherein the characteristic curve is approximated by several subsections, and
   wherein the subsections continuously merge into each other and are described by first or second order polynomial functions.

5. The method according to claim 1, further comprising:
   measuring the temperature of the capacitor, or
   estimating the temperature based on an ambient temperature of the capacitor, taking into account one or more of: a voltage across the capacitor, the discharging current through the capacitor, and a frequency of the discharging current.

6. The method according to claim 1, further comprising:
   determining an end of service life to be a time when the corrected capacitance has decreased by more than a predetermined proportion below the initial capacitance,
   wherein the predetermined proportion is between 15% and 50%.

7. The method according to claim 1, wherein the discharging time is selected such that the capacitor is discharged quasi-linearly during the discharging time.

8. The method according to claim 1, wherein measuring the voltage change further comprises:
   measuring a voltage across the capacitor at a beginning of the discharging time;
   measuring a voltage across the capacitor at an end of the discharging time; and
   calculating the voltage change to be a difference between the voltage measured at the beginning of the discharging time and the voltage measured at the end of the discharging time.

9. The method according to claim 1, further comprising:
   determining the initial capacitance when the capacitor is first put into operation, the initial capacitance being determined based on an error correction that corrects for influences of a temperature on the capacitance of the capacitor.

10. The method according to claim 1, further comprising:
    determining the initial capacitance by performing multiple measurements of a capacitance of the capacitor; and
    generating a mean value of the multiple capacitance measurements; and
    identifying the mean value of the capacitance as the initial capacitance.

11. The method according to claim 1, further comprising determining the initial capacitance after a burn-in period of time.

12. An assessment device configured to determine a remaining service life of a capacitor, the assessment device comprising:
    a voltage input device configured to receive a measured value of a voltage change across the capacitor during a discharging time;
    a current input device configured to receive a measured value of a discharging current, wherein the current input device is configured to measure the discharging current during the discharging time;
    a capacitance detecting device configured to detect an actual capacitance of the capacitor based on the voltage change, the discharging current, and the discharging time;
    a correcting device configured to determine a corrected capacitance based on the actual capacitance by performing an error correction, wherein influences of a temperature on a capacitance of the capacitor are corrected by the error correction; and an evaluation device configured to determine the remaining service life of the capacitor based on a difference between the corrected capacitance and an initial capacitance of the capacitor.

13. A system comprising:
the assessment device of claim 12; and
a circuit comprising at least one capacitor,
wherein the system is configured to determine a remaining service life of the capacitor by performing operations including:
charging and discharging the capacitor one or more times; and
causing the assessment device to determine the remaining service life of the capacitor a respective one or more times.

14. The system according to claim 13, wherein the circuit further comprises a DC intermediate circuit in which at least one capacitor is configured as a buffer capacitor.

15. The system according to claim 13, further comprising an intermediate circuit monitoring device,
wherein the intermediate circuit monitoring device is configured to measure a voltage across the at least one capacitor and to feed the measured voltage to the voltage input device of the assessment unit.

16. The system according to claim 13 further comprising a current detection device comprising:
a current sensor configured to measure the discharging current; or
a current calculating device configured to calculate the discharging current based on other measured values of other physical variables within the circuit, the other measured values including a power which is output by an inverter circuit of the circuit and a voltage of the capacitor.

17. The system according to claim 13, further comprising:
a frequency detection device configured to determine a frequency of the discharging current, wherein the frequency detection unit determines the frequency of the discharging current based on a measured frequency of a control signal of a power stage of the circuit.

18. The system according to claim 13, further comprising:
an output device configured to indicate the determined remaining service life; and/or
configured to issue a warning when an end of the remaining service life is reached.

19. The method of claim 6, wherein the predetermined proportion is between 15% and 30%.

20. The method of claim 6, wherein the predetermined proportion is 20%.

* * * * *